(12) United States Patent
Nishizawa

(10) Patent No.: US 9,041,995 B2
(45) Date of Patent: May 26, 2015

(54) DISPLAY DEVICE

(75) Inventor: Shigeki Nishizawa, Mobara (JP)

(73) Assignee: Pixtronix, Inc., San Diego, CA (US)

( * ) Notice: Subject to any disclaimer, the term of this patent is extended or adjusted under 35 U.S.C. 154(b) by 54 days.

(21) Appl. No.: 13/609,329

(22) Filed: Sep. 11, 2012

(65) Prior Publication Data

US 2013/0077146 A1   Mar. 28, 2013

(30) Foreign Application Priority Data

Sep. 22, 2011 (JP) ................ 2011-206777

(51) Int. Cl.
| | | |
|---|---|---|
| G02B 26/02 | (2006.01) | |
| G02B 26/08 | (2006.01) | |
| B81B 3/00 | (2006.01) | |
| H02N 1/00 | (2006.01) | |

(52) U.S. Cl.
CPC .......... *G02B 26/023* (2013.01); *G02B 26/0841* (2013.01); *B81B 3/0021* (2013.01); *H02N 1/004* (2013.01); *B81B 2203/051* (2013.01)

(58) Field of Classification Search
CPC .. G02B 26/02; G02B 26/023; G02B 26/0841; B81B 2203/0307; B81B 2203/051; B81B 3/0021; G09G 2300/0809; G09G 2310/0262; H02N 1/004
USPC ............ 359/230, 232, 233, 290, 298; 345/55
See application file for complete search history.

(56) References Cited

U.S. PATENT DOCUMENTS

| | | |
|---|---|---|
| 6,679,055 B1 | 1/2004 | Ellis |
| 6,806,991 B1 | 10/2004 | Sarkar et al. |
| 2006/0250325 A1 | 11/2006 | Hagood et al. |
| 2007/0223080 A1 | 9/2007 | Hagood et al. |
| 2011/0004388 A1 | 1/2011 | Winter |
| 2011/0235147 A1* | 9/2011 | Lee et al. ............ 359/230 |

FOREIGN PATENT DOCUMENTS

| | | |
|---|---|---|
| CN | 101128766 B | 1/2011 |
| CN | 101995655 A | 3/2011 |
| CN | 102200635 A | 9/2011 |
| JP | 2008-197668 | 8/2008 |

(Continued)

OTHER PUBLICATIONS

Partial European Search Report—EP12183957—Search Authority—Munich—Oct. 9, 2013.

(Continued)

*Primary Examiner* — James Phan

(74) *Attorney, Agent, or Firm* — Edward A. Gordon; Foley & Lardner LLP

(57) ABSTRACT

A fixed aperture includes a first fixed slit and a second fixed slit which are arranged respectively in regions positioned on both sides with a moving line sandwiched therebetween. A drive aperture includes a first drive slit and a second drive slit which are arranged on both sides with the moving line sandwiched therebetween. The first fixed slit and the first drive slit are formed in an extending manner along a first line, and are arranged such that these slits communicate with each other when a shutter is at a position where the transmission of light is allowed. The second fixed slit and the second drive slit are formed in an extending manner along a second line which intersects with the first line, and are arranged such that these slits communicate with each other when the shutter is at a position where the transmission of light is allowed.

21 Claims, 7 Drawing Sheets

(56) References Cited

FOREIGN PATENT DOCUMENTS

| | | |
|---|---|---|
| KR | 20110077912 A | 7/2011 |
| KR | 20110108129 A | 10/2011 |
| TW | 201007802 A | 2/2010 |

OTHER PUBLICATIONS

European Search Report—EP12183957—Search Authority—Munich—Jan. 22, 2014.
Taiwan Search Report—TW101131063—Tipo—Jul. 9, 2014.

* cited by examiner

DISPLAY DEVICE

CROSS-REFERENCE TO RELATED APPLICATION

The present application claims priority from Japanese application JP2011-206777 filed on Sep. 22, 2011, the contents of which are hereby incorporated by reference into this application.

BACKGROUND OF THE INVENTION

1. Field of the Invention
The present invention relates to a display device.
2. Description of the Related Art
An MEMS display (Micro Electro Mechanical System Display) is a display which is expected to take the place of a liquid crystal display (see JP 2008-197668 A). This display, unlike a liquid-crystal shutter type display which makes use of polarization, displays a tone by mechanically opening or closing a light transmitting window using a shutter unit having a shutter. To be more specific, the shutter having a drive aperture is arranged above a light blocking film where a fixed aperture is formed.

Further, in the structure shown in JP 2008-197668 A, the shutter is configured to be driven by an electrostatic force generated between a first beam and a second beam. One end of the first beam is connected to the shutter, and the other end of the first beam is fixed to an anchor portion. The shutter is moved as the first beam is deformed about a fixing point.

The shutter is configured to be driven by being arranged with a gap between the shutter and a light blocking film, and when the fixed aperture and the drive aperture communicate with each other, light which advances perpendicular to a screen passes through the fixed aperture and the drive aperture. On the other hand, light which obliquely advances through the fixed aperture is blocked by the shutter even when the fixed aperture and the drive aperture communicate with each other. When the fixed aperture and the drive aperture are elongated, light which advances obliquely along the longitudinal direction passes through the drive aperture, light which advances obliquely along the lateral direction runs off from the drive aperture and is blocked by the shutter. Accordingly, there exists a drawback on a field-of-view characteristic that the brightness differs depending on the viewing direction.

Further, in the structure shown in JP 2008-197668 A, although first beams extend from opposing sides of the rectangular shutter, on each one side of the shutter, a pair of first beams extends in the directions opposite to each other along the side from the center portion. Accordingly, a length of one first beam is short, that is, one half or less of a length of one side. Further, a length of the second beam is also short correspondingly to the length of the first beam so that an electrostatic force between the first beam and the second beam is decreased. Still further, the rigidity of the shutter between the first beam and the second beam is increased and hence, there arises a drawback that it is difficult to move the shutter and thereby a movable distance of the shutter becomes short, or it is necessary to increase the potential difference between the first beam and the second beam to move the shutter a desired distance.

SUMMARY OF THE INVENTION

It is an object of the present invention to overcome a drawback on a field-of-view characteristic or to ensure a movable distance of a shutter.

(1) According to one aspect of the present invention, there is provided a display device which includes: a light blocking film in which a fixed aperture which allows the transmission of light is formed; a shutter which has a drive aperture and controls the transmission of light and the interruption of the transmission of the light; and a drive part which moves the shutter and the drive aperture along a moving line which extends in a predetermined direction, wherein the fixed aperture includes at least a fixed slit which extends in a direction which differs from the predetermined direction and also differs from a direction orthogonal to the predetermined direction, and the drive aperture includes at least a drive slit which extends in the direction that the fixed slit extends. According to the present invention, it is possible to realize the display device having a shutter which can enhance a field-of-view characteristic.

(2) In the display device described in (1), the fixed aperture may include a first fixed slit and a second fixed slit which are arranged in a first region and a second region respectively, the first region and a second region being positioned with the moving line sandwiched therebetween, the drive aperture may include a first drive slit and a second drive slit which are arranged in the first region and the second region respectively, the first fixed slit and the first drive slit may be formed in an extending manner along a first line, and the second fixed slit and the second drive slit may be formed in an extending manner along a second line which intersects with the first line. According to the present invention, the direction along which the first fixed slit and the first drive slit extend and the direction along which the second fixed slit and the second drive slit extend intersect with each other and hence, a field of view can be widened in two directions whereby brightness can be enhanced in these directions.

(3) In the display device described in (2), the display device may include a plurality of pixels arranged in a matrix array, each one of the plurality of pixels may have a rectangular shape which is formed of a pair of first sides which extends in the first direction and a pair of second sides which extends in the second direction, each one of the plurality of pixels may include one shutter and at least one fixed aperture, the shutter may include at least one drive aperture, the first direction may be the direction of the first line, and the second direction may be the direction of the second line, and the predetermined direction of the moving line may be the direction of a diagonal line of the rectangular shape.

(4) In the display device described in (2) or (3), the moving line may be the direction which bisects an angle made by the first line and the second line. Further, the angle made by the first line and the second line may be 90 degrees.

(5) In the display device described in any one of (2) to (4), the first fixed slit and the second fixed slit may be formed into an integral L shape or V shape by connecting an end portion of the first fixed slit and an end portion of the second fixed slit to each other, and the first drive slit and the second drive slit may be formed into an integral L shape or V shape by connecting an end portion of the first drive slit and an end portion of the second drive slit to each other.

(6) In the display device described in any one of (2) to (4), the first fixed slit and the second fixed slit may be formed in a spaced-apart manner with a predetermined distance therebetween, and the first drive slit and the second drive slit may be formed in a spaced-apart manner with a predetermined distance therebetween.

(7) In the display device described in any one of (2) to (6), the display device may include a plurality of pixels arranged in a matrix array, each one of the plurality of pixels may include one shutter and the plurality of fixed apertures, and the shutter may include the plurality of drive apertures. Further, the number of the plurality of fixed apertures and the number of the plurality of drive apertures may be equal. Alternatively, the number of the plurality of fixed apertures may be larger than the number of the plurality of drive apertures.

(8) In the display device described in any one of (2) to (7), the display device may include a pair of substrates which is arranged to face each other, the drive part may be formed on one substrate out of the pair of substrates, the drive part may include a first electrode which supports the shutter in a spaced-apart manner from one substrate with a predetermined distance, and a second electrode which faces the first electrode at a position on a side opposite to a shutter side of the first electrode, and the shutter may be moved by a potential difference between the first electrode and the second electrode.

(9) In the display device described in (8), the pair of second electrodes maybe formed with the shutter sandwiched therebetween, each one of the pair of second electrodes may be arranged on both sides of the shutter along the moving line respectively, and the first electrode may be provided between each one of the pair of second electrodes and the shutter.

(10) In the display device described in (9), the first electrode may include a pair of first beams which is arranged so as to have portions which are respectively arranged adjacent to two neighboring sides of a minimum quadrangular shape which circumscribes a planar profile of the shutter, the second electrode may include a pair of second beams which is arranged so as to have portions which are respectively arranged adjacent to the pair of first beams, and one first beam and one second beam may face each other in an opposed manner.

(11) In the display device described in (10), each first beam may include: an intermediate portion which faces one of the second beams arranged adjacent to the first beams; a connecting portion which extends from one end of the intermediate portion and is connected to the shutter; and a fixing point whose position on one substrate is fixed on a side of the intermediate portion opposite to the connecting portion, and a distance from the connecting portion to a corner between two sides arranged adjacent to the first electrode may be set smaller than a distance from the fixing point to the corner.

(12) In the display device described in (11), a distance between the intermediate portion and one second beam on a side closer to the fixing point may be smaller than the distance between the intermediate portion and one second beam on a side closer to the connecting portion.

(13) In the display device described in (11) or (12), the intermediate portion may include an opposedly-facing region which faces the planar profile of the shutter in an opposed manner, and may include an extending region between the opposedly-facing region and the fixing point.

(14) According to another aspect of the present invention, there is provided a display device which includes: a pair of substrates which is arranged to face each other; a light blocking film in which a fixed aperture which allows the transmission of light is formed; a shutter which has a drive aperture and controls the transmission of the light and the interruption of the transmission of the light; and a drive part which moves the shutter and the drive aperture along a moving line which is the predetermined direction, wherein the drive part is formed on one substrate out of the pair of substrates, the drive part includes a pair of first electrodes which supports the shutter in a spaced-apart manner from one substrate with a predetermined distance, and a pair of second electrodes which respectively faces the pair of first electrodes at positions on a side opposite to a shutter side of the pair of first electrodes, each one of the pair of first electrodes is arranged on both sides of the shutter along the moving line, the shutter is moved by a potential difference between the first electrode and the second electrode which face each other in an opposed manner, the pair of first electrodes is arranged so as to have portions which are respectively arranged adjacent to a diagonal of a minimum quadrangular shape which circumscribes a planar profile of the shutter, each first electrode includes a pair of first beams which is arranged so as to have portions arranged adjacent to two sides which sandwich one of diagonals, each second electrode has a pair of second beams which is arranged so as to have portions arranged adjacent to the pair of first beams, and one first beam and one second beam face each other in an opposed manner. According to the present invention, the pair of first beams is arranged adjacent to two sides of the shutter and hence, compared to the structure where a pair of first beams is arranged along one side of a shutter, a length of the first beam can be elongated. Due to such a constitution, an electrostatic force between the first beam and the second beam can be increased compared to the conventional structure even when the same voltage is applied. Further, the length of the first beam and a length of the second beam are elongated compared to the conventional structure and hence, the rigidities of these beams are also lowered compared to the conventional structure and hence, it becomes possible to easily move the shutter. Still further, by elongating the length of the first beam, it is also possible to acquire an advantageous effect that a movable distance of the shutter can be increased compared to the conventional structure.

(15) In the display device described in (14), the display device may include a plurality of pixels arranged in a matrix array, each one of the plurality of pixels may have a rectangular shape; and the predetermined direction of the moving line may be the direction of a diagonal line of the rectangular shape.

(16) In the display device described in (14) or (15), each first beam may include: an intermediate portion which faces one of second beams arranged adjacent to the first beams; a connecting portion which extends from one end of the intermediate portion and is connected to the shutter; and a fixing point whose position on one substrate is fixed on a side of the intermediate portion opposite to the connecting portion, and a distance from the connecting portion to one of the diagonals arranged adjacent to the first electrode may be set smaller than a distance from the fixing point to one diagonal.

(17) In the display device described in (16), a distance between the intermediate portion and one second beam on a side closer to the fixing point may be smaller than the distance between the intermediate portion and one second beam on a side closer to the connecting portion.

(18) In the display device described in (16) or (17), the intermediate portion may include an opposedly-facing region which faces the planar profile of the shutter in an opposed manner, and may include an extending region between the opposedly-facing region and the fixing point.

DETAILED DESCRIPTION OF THE INVENTION

Hereinafter, an embodiment of the present invention is explained in conjunction with drawings.

Figure 1:
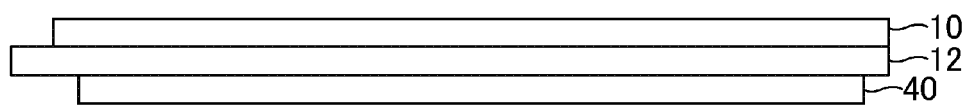
FIG. 1 is a side view of a display device according to an embodiment of the present invention.
Figure 2:
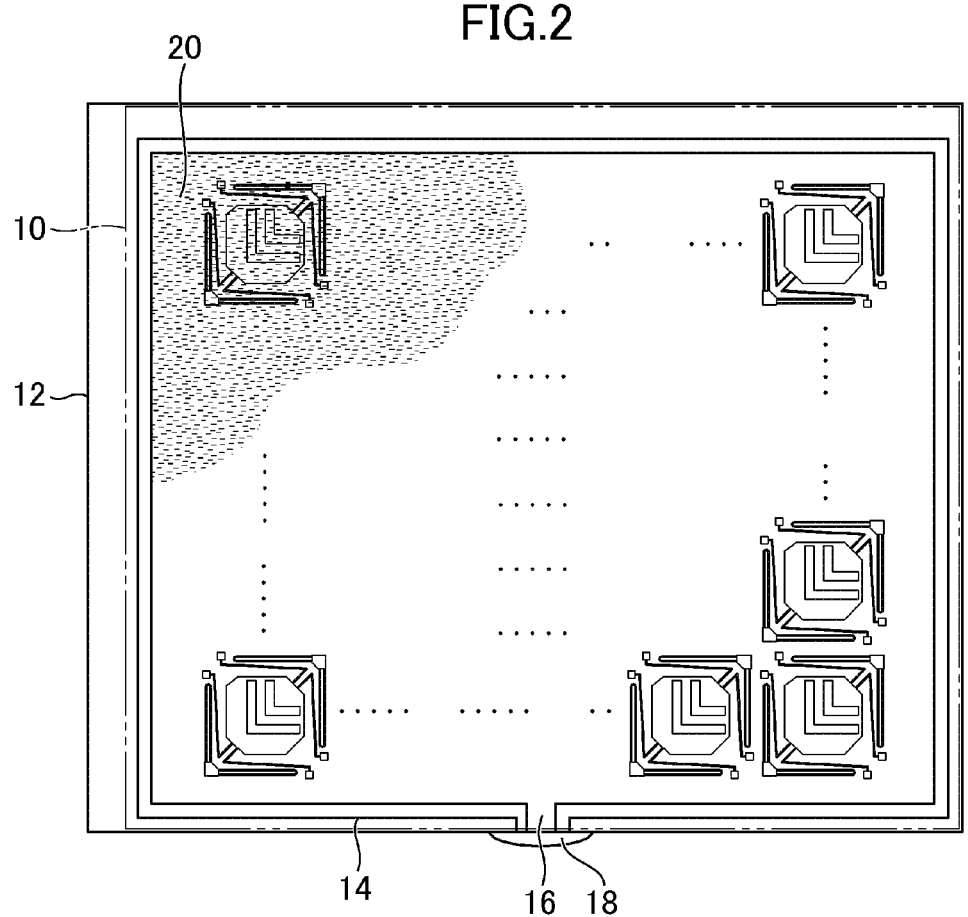
FIG. 2 is a plan view of a display device shown in FIG. 1.

FIG. 1 is a side view schematically showing a display device according to the embodiment of the present invention. The display device includes a pair of substrates 10, 12 (for example, glass substrates) having optical transmissivity. The pair of substrates 10, 12 is arranged in an opposed manner with a gap therebetween. FIG. 2 is a plan view of the display device shown in FIG. 1. FIG. 2 shows the internal structure of the display device while indicating the upper-side substrate 10 by an imaginary line.

The pair of substrates 10, 12 is fixed to each other by a sealing material 14 shown in FIG. 2 with a gap therebetween. The sealing material 14 adheres to opposedly facing surfaces of the pair of substrates 10, 12. Further, as shown in FIG. 2, the sealing material 14 is formed in a state where the sealing material 14 surrounds a space defined between the pair of substrates 10, 12 while forming a slit 16. An end seal 18 closes the slit 16 formed in the sealing material 14 so that the space surrounded by the sealing material 14 is sealed thus forming a sealed space. The sealed space is filled with oil 20 (for example, silicone oil). When the pair of substrates 10, 12 is made of glass, with the use of oil 20 having a refraction index close to a refraction index of glass, by filling the sealed space with oil 20, the reflection of light on interfaces between oil 20 and the pair of substrates 10, 12 can be decreased.

Figure 3:
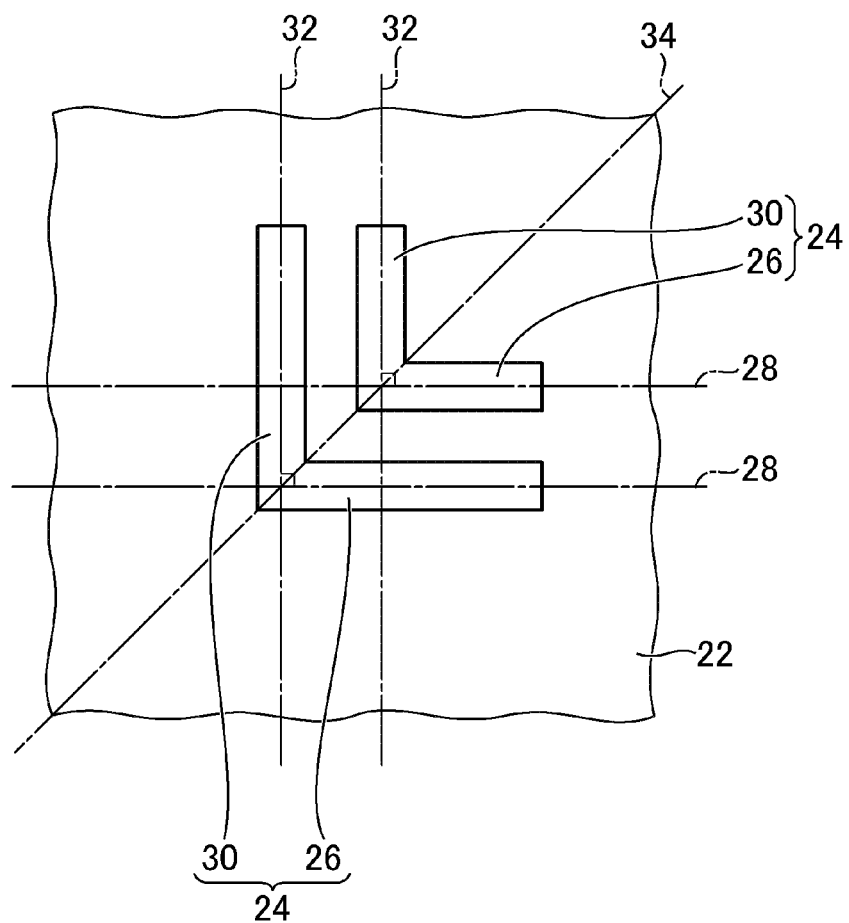
FIG. 3 is a view showing a light blocking film.

FIG. 3 is a plan view showing a portion of the internal structure of the display device in an enlarged manner. On one substrate out of the pair of substrates 10, 12, a light blocking film 22 is formed on a side which faces the other substrate in an opposed manner. A plurality of fixed apertures 24 which respectively allow light to pass therethrough are formed in the light blocking film 22. With respect to a surface of the light blocking film 22 on a backlight 40 (see FIG. 1) side, a region of the surface of the light blocking film 22 other than the fixed apertures 24 is formed of a high reflection film such that light irradiated from the backlight 40 can be reflected toward the backlight 40 side. The reflected light returns to the backlight 40 side and is used again as a light which passes through the fixed apertures 24. On the other hand, with respect to a surface of the light blocking film 22 on a counter substrate side (or a side opposite to the backlight 40), it is desirable that a region of the surface of the light blocking film 22 other than the fixed apertures 24 is formed of a low reflection film from a viewpoint of preventing turning around of an undesired light.

The fixed aperture 24 includes a first fixed slit 26. The first fixed slit 26 is formed in an extending manner along a first line 28. The first line 28 is a straight line. A plurality of first fixed slits 26 respectively extend along a plurality of first lines 28 which are arranged parallel to each other.

The fixed aperture 24 includes a second fixed slit 30. The second fixed slit 30 is formed in an extending manner along a second line 32. The second line 32 is a straight line. The second line 32 intersects with the first line 28. An angle made by the first line 28 and the second line 32 is 90 degrees, for example. A plurality of second fixed slits 30 respectively extend along a plurality of second lines 32 which are arranged parallel to each other.

The first fixed slit 26 and the second fixed slit 30 are formed into an integral L shape or an integral V shape by connecting an end portion of the first fixed slit 26 and an end portion of the second fixed slit 30. The first fixed slit 26 and the second fixed slit 30 are respectively arranged on regions on both sides which sandwich a moving line 34 of a shutter 36 shown in FIG. 4. The moving line 34 is a straight line. It is desirable that the direction of the moving line 34 is the direction which bisects an angle made by the first line 28 and the second line 32 which intersect with each other.

Figure 4:
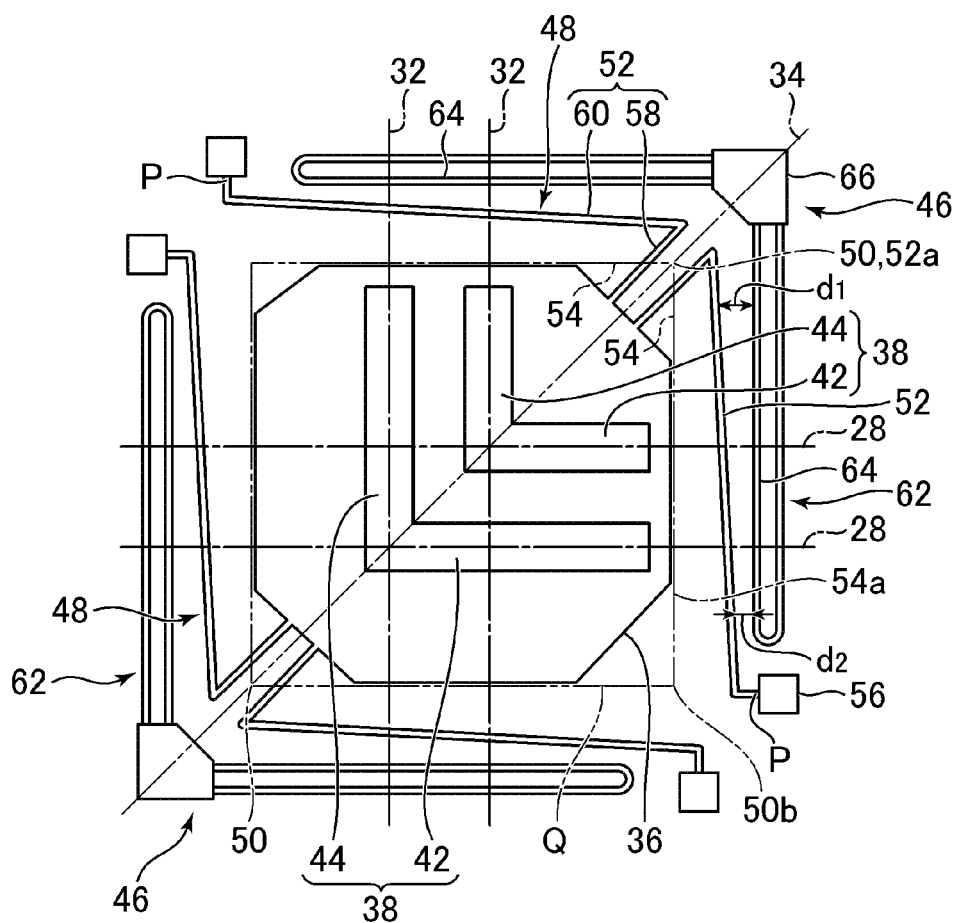
FIG. 4 is a view showing a shutter and a drive part for driving the shutter.

FIG. 4 is a plan view showing another portion of the internal structure of the display device in an enlarged manner. The display device includes the shutter 36. The shutter 36 is mounted on one substrate out of the pair of substrates 10, 12. FIG. 3 and FIG. 4 show the structure where the shutter 36 is mounted on one substrate out of the pair of substrates 10, 12, and the light blocking film 22 is formed on the other substrate. However, both the shutter 36 and the light blocking film 22 may be mounted on one substrate out of the pair of substrates 10, 12.

Figure 5:
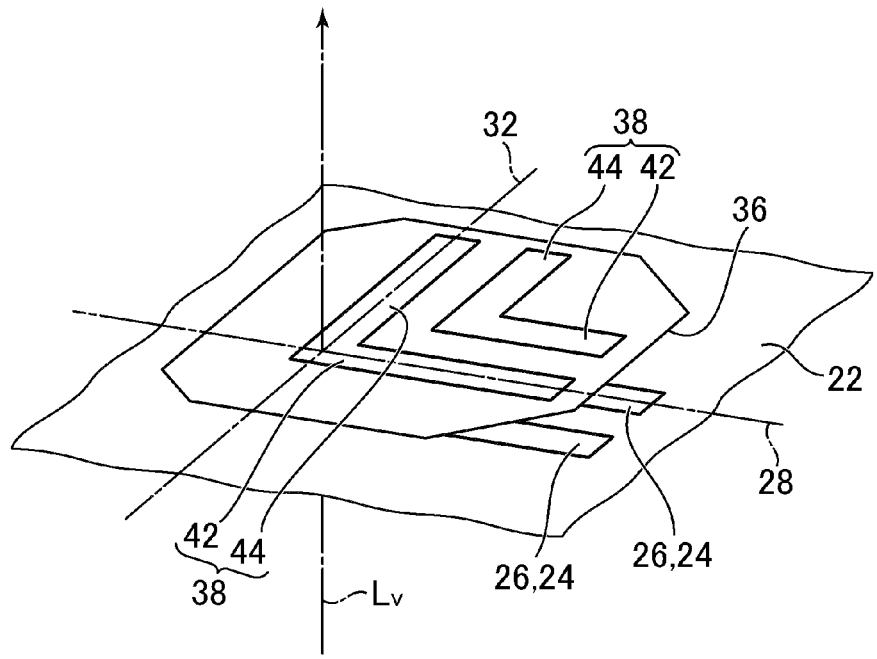
FIG. 5 is a view showing the shutter and the light blocking film.

FIG. 5 is a view showing the shutter 36 and the light blocking film 22. A plurality of shutters 36 are arranged in a spaced-apart manner from the light blocking film 22. The shutter 36 has a drive aperture 38 corresponding to the fixed aperture 24, and the shutter controls the transmission and the interruption of light corresponding to the fixed aperture 24. That is, light passes through the fixed aperture 24 and the drive aperture 38 when the fixed aperture 24 and the drive aperture 38 communicate with each other, and a light is blocked by portions of the shutter 36 other than the drive aperture 38. A light is supplied from the backlight 40 (see FIG. 1) which is arranged so as to overlap with the substrates 10, 12.

The drive aperture 38 has a first drive slit 42. The first drive slit 42 is formed in an extending manner along the first line 28. A plurality of first drive slits 42 respectively extend along a plurality of first lines 28. The drive aperture 38 includes a second drive slit 44. The second drive slit 44 is formed in an extending manner along the second line 32 which intersects with the first line 28. A plurality of second drive slits 44 extend respectively along a plurality of second lines 32.

The first drive slit 42 and the second drive slit 44 are arranged respectively on both sides which sandwich the moving line 34 of the shutter 36. The first drive slit 42 and the second drive slit 44 are formed into an integral L shape or an integral V shape by connecting an end portion of the first drive slit 42 and an end portion of the second drive slit 44.

The first fixed slit 26 and the first drive slit 42 are arranged such that these slits communicate with each other when the shutter 36 is at a position where the transmission of light is allowed. In the same manner, the second fixed slit 30 and the second drive slit 44 are arranged such that these slits communicate with each other when the shutter 36 is at a position where the transmission of light is allowed.

As shown in FIG. 4, the display device includes drive parts 46 which move the shutter 36 along the moving line 34 between the position where the transmission of light is allowed and a position there the transmission of light is interrupted. The drive part 46 includes a first electrode 48 which supports the shutter 36 (that is, the electrode 48 which holds a main plane of the shutter 36 at a position spaced apart from the light blocking film 22 by a predetermined distance). A pair of first electrodes 48 respectively supports the shutter 36 on sides opposite to each other along the moving line 34 of the shutter 36. The pair of first electrodes 48 is arranged so as to have portions respectively arranged adjacent to a diagonal 50 of a minimum quadrangular shape Q which circumscribes a planar profile of the shutter 36.

The first electrode 48 includes a pair of first beams 52. The pair of first beams 52 is arranged so as to have portions which are respectively arranged adjacent to two neighboring sides 54 (two sides 54 sandwiching one of the diagonals 50) of the minimum quadrangular shape Q which circumscribes the planar profile of the shutter 36. The shutter 36 is supported by the first beams 52 and is configured to float from the substrate 10 or 12 (that is, the main plane of the shutter 36 being positioned in a spaced-apart manner from the light blocking film 22 by a predetermined distance). The shutter 36 is supported by a plurality of (four in FIG. 4) first beams 52. The first beam 52 is fixed to the substrate 10 or 12 at a first anchor portion 56. The first beam 52 is made of an elastically deformable material, and is arranged to be deformable (movable) in the direction approximately parallel to the main plane of the shutter 36.

The first beam 52 has a connecting portion 58 which is connected to the shutter 36. An intermediate portion 60 extends from the connecting portion 58. An end portion of the first beam 52 has a fixing point P on a side of the intermediate portion 60 opposite to the connecting portion 58, and the position of the end portion of the first beam 52 is fixed at the fixing point P. That is, the first anchor portion 56 is provided at the fixing point P. The connecting portion 58 is arranged closer to a corner 50a between two sides 54 arranged adjacent to the first electrode 48 (one of a pair of diagonals 50 arranged adjacent to the pair of first electrodes 48) than the fixing point P. The fixing point P is arranged closer to another corner 50b arranged next to the corner 50a formed between two sides 54 with one side 54a being arranged adjacent to the intermediate portion 60 sandwiched therebetween than the connecting portion 58. The intermediate portion 60 extends such that an end portion of the intermediate portion 60 on a fixing point P side extends beyond a region where the intermediate portion 60 is arranged adjacent to and face the side 54a in an opposed manner.

The drive part 46 includes a second electrode 62. The second electrode 62 faces the first electrode 48 in an opposed manner on a side more remote from the shutter 36 than the first electrode 48 is. The pair of second electrodes 62 respectively faces the pair of first electrodes 48 with a gap therebetween at positions on a side of the pair of first electrodes 48 opposite to the shutter 36. The second electrodes 62 have a pair of second beams 64 which is arranged such that the second beams 64 have portions which are arranged adjacent to the pair of first beams 52 respectively. One first beam 52 and one second beam 64 face each other in an opposed manner.

The second beam 64 is supported on a second anchor portion 66 formed on the substrate 10 or 12. The second beam 64 faces the intermediate portion 60 of the neighboring first beam 52 in an opposed manner. The distance between the intermediate portion 60 and the second beam 64 arranged adjacent to each other is set such that the distance is wide on a side close to the connecting portion 58 ($d_1$ in FIG. 4) and is narrow on a side close to the fixing point P ($d_2$ in FIG. 4) (that is, the relationship $d_1 > d_2$ being established). The pair of second electrodes 62 is arranged on both sides along the moving line 34 of the shutter 36 respectively such that the pair of second electrodes 62 sandwiches the shutter 36. The first electrode 48 is arranged between the respective second electrodes 62 and the shutter 36.

Desired potentials are applied to one first electrode 48 and one second electrode 62 which face each other in an opposed manner respectively so that the shutter 36 is moved along with the movement of the first electrode 48 corresponding to a magnitude of an electrostatic force (in other words, magnitude of potential difference) generated between one first electrode 48 and one second electrode 62 which face each other in an opposed manner. When the drive aperture 38 formed in the shutter 36 and the fixed aperture 24 formed in the light blocking film 22 communicate with each other, light passes through these apertures, while when the fixed aperture 24 formed in the light blocking film 22 is blocked due to the movement of the shutter 36, the transmission of light is interrupted. In other words, the shutter 36 is mechanically driven so as to control the transmission of light through the fixed aperture 24 formed in the light blocking film 22 and the interruption of transmission of light. The shutter 36 having the drive aperture 38, the fixed aperture 24 corresponding to the drive aperture 38 and the shutter 36 and the drive part 46 which constitute one unit form one pixel, and an image is displayed by a large number of pixels. Accordingly, a plurality of (a large number of) shutters 36 (that is, a plurality of above-mentioned units) are provided.

The shield space is, as shown in FIG. 2, filled with oil 20 (for example, silicone oil). The shutters 36 and the drive parts 46 are arranged in oil 20. By filling the shield space with oil 20, a dielectric constant is increased so that a drive voltage for moving the shutter 36 to a desired position by an electrostatic force (that is, voltage applied to the first electrode 48 or the second electrode 62) can be lowered. Vibrations generated by the movement of the shutters 36 and the drive parts 46 can be suppressed by oil 20 so that sticking of the first beam 52 and the second beam 64 to each other can be also prevented.

Figure 6:
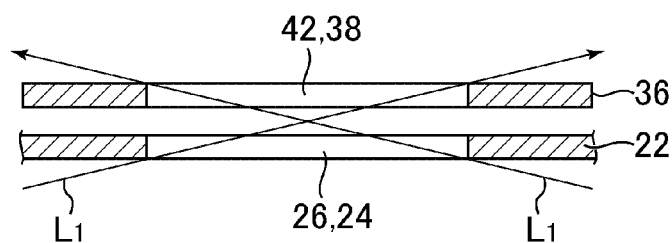
FIG. 6 is a view showing a longitudinal cross section of a first fixed slit and a first drive slit.
Figure 7:
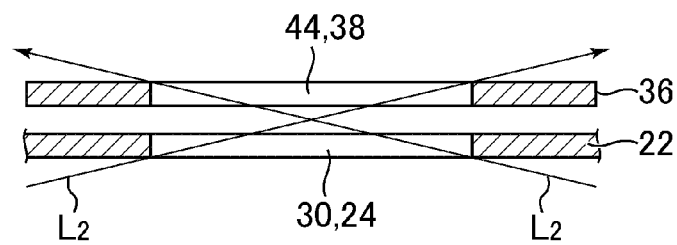
FIG. 7 is a view showing a longitudinal cross section of a second fixed slit and a second drive slit.

FIG. 6 is a view showing a longitudinal cross section of the first fixed slit 26 and the first drive slit 42. FIG. 7 is a view showing a longitudinal cross section of the second fixed slit 30 and the second drive slit 44.

According to this embodiment, a light which passes through the fixed aperture 24 is constituted of a light $L_V$ which advances perpendicular to the fixed aperture 24 (perpendicular to a surface of the light blocking film 22) (see FIG. 5) and a light which advances obliquely with respect to the fixed aperture 24 (oblique to the surface of the light blocking film 22). The obliquely advancing light includes a light $L_1$ which is inclined in the direction of the first line 28 (a light which advances on a plane perpendicular to the surface of the light blocking film 22 and parallel to the first line 28, see FIG. 6), and a light $L_2$ which is inclined in the direction of the second line 32 (a light which advances on a plane perpendicular to the surface of the light blocking film 22 and parallel to the second line 32, see FIG. 7).

When the first fixed slit 26 and the first drive slit 42 communicate with each other, the light $L_V$ which passes through the first fixed slit 26 perpendicularly (in the direction perpendicular to the surface of the light blocking film 22) further passes through the first drive slit 42 (see FIG. 5). The light $L_1$ which is inclined in the direction of the first line 28 is also inclined in the longitudinal direction of the first drive slit 42 and hence, the light $L_1$ also passes through the first drive slit 42 from the first fixed slit 26 (see FIG. 6).

Since the second fixed slit 30 and the second drive slit 44 also communicate with each other, the light $L_V$ which passes through the second fixed slit 30 perpendicularly (in the direction perpendicular to the surface of the light blocking film 22)

further passes through the second drive slit 44 (see FIG. 5). The light L₂ which is inclined in the direction of the second line 32 is inclined in the longitudinal direction of the second drive slit 44 and hence, the light L₂ also passes through the second drive slit 44 from the second fixed slit 30 (see FIG. 7).

Accordingly, the direction along which the first fixed slit 26 and the first drive slit 42 extend (the direction of the first line 28) and the direction along which the second fixed slit 30 and the second drive slit 44 extend (the direction of the second line 32) intersect with each other and hence, compared to the conventional structure having rectangular (elongated quadrangular) fixed apertures and drive apertures (see FIG. 2 of JP 2008-197668 A), a balance of a field-of-view characteristic in the lateral direction as well as in the vertical direction can be improved. That is, the field-of-view characteristic can be enhanced and hence, the display device can acquire high quality. The structure which has fixed slits and drive slits extending in one direction different from the moving line 34 of the shutter 36, that is, the structure which has only the first fixed slits 26 and the first drive slits 42, and does not have second fixed slits 30 and the second drive slits 44 can also enhance the field-of-view characteristic compared to the conventional structure (see FIG. 2 of JP 2008-197668 A).

In the conventional structure (see FIG. 2 of JP 2008-197668 A), a pair of first beams extends in the directions opposite to each other along a side of a shutter (corresponding to one side 54a of this embodiment shown in FIG. 4) from a center portion of the shutter and hence, a length of one first beam becomes short, that is, one half or less of one side of the shutter of this embodiment. To the contrary, according to this embodiment, the pair of first beams 52 can be arranged adjacent to two neighboring sides 54 of the minimum quadrangular shape Q which circumscribes the planar profile of the shutter 36 and hence, the length of the first beam 52 of this embodiment can be elongated twice as large as the length of the first beam of the conventional structure. Further, the second beam can be also elongated corresponding to the elongation of the first beam and hence, an area where the first beam and the second beam face each other in an opposed manner is also increased whereby an electrostatic force between the first beam and the second beam can be increased compared to the conventional structure even when the same voltage is applied. Still further, the length of the first beam and the length of the second beam can be elongated compared to the conventional structure and hence, the rigidities of these beams can be also lowered compared to the conventional structure and hence, it becomes possible to easily move the shutter 36. Still further, by elongating the length of the first beam, this embodiment also has an advantageous effect that a movable distance of the shutter 36 can be increased compared to the conventional structure.

Figure 8:
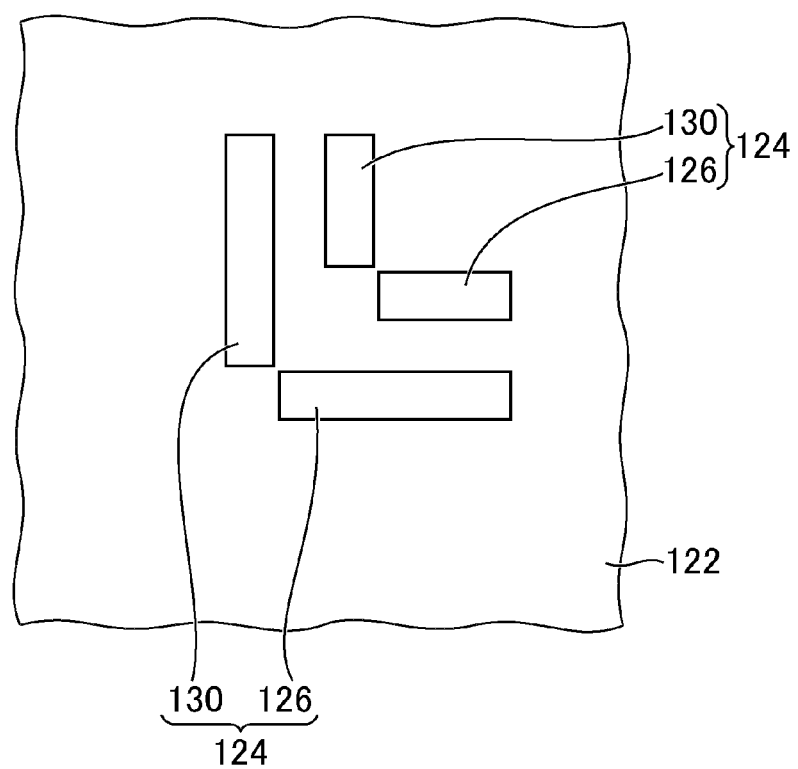
FIG. 8 is a view showing a light blocking film according to a modification of this embodiment.
Figure 9:
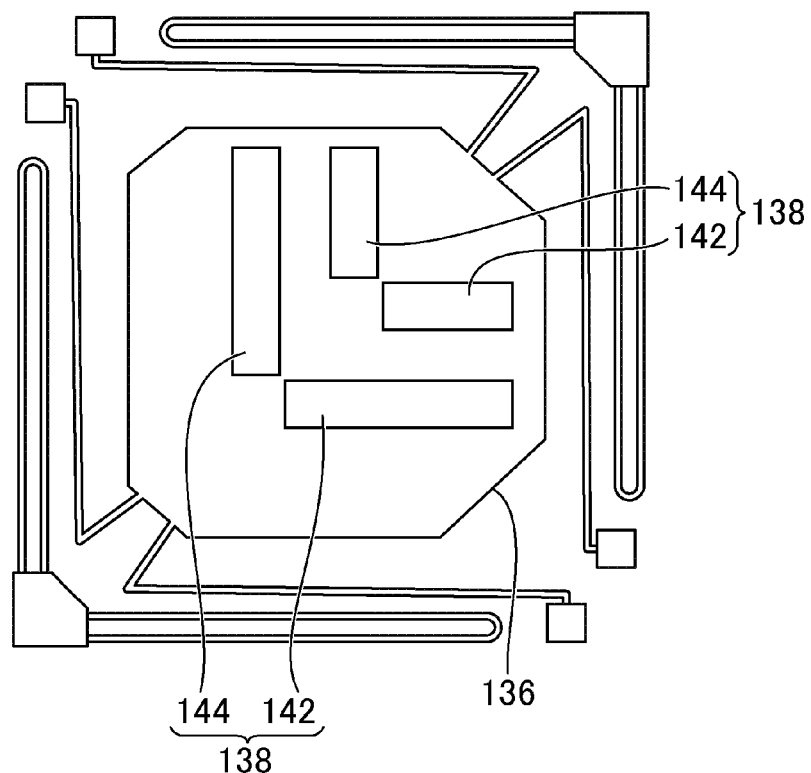
FIG. 9 is a view showing a shutter according to the modification of this embodiment.

FIG. 8 is a view showing a light blocking film according to a modification of this embodiment. FIG. 9 is a view showing a shutter according to the modification of this embodiment. This modification differs from the above-mentioned embodiment with respect to a shape of a fixed aperture 124 formed in a light blocking film 122 and a shape of a drive aperture 138 formed in a shutter 136. That is, the first fixed slit 126 and the second fixed slit 130 are formed separately in a spaced-apart manner. The first drive slit 142 and the second drive slit 144 are separately formed in a spaced-apart manner. Other structures are substantially equal to the structures explained in conjunction with the above-mentioned embodiment.

The present invention is not limited to the above-mentioned embodiments, and various modifications are conceivable. That is, the constitutions explained in conjunction with the embodiments may be replaced with the constitutions substantially equal to the constitution of the above-mentioned embodiments, constitutions which can acquire the same manner of operation and advantageous effects as the above-mentioned embodiments or constitutions which can achieve the same object as the above-mentioned embodiments.

Figure 10:
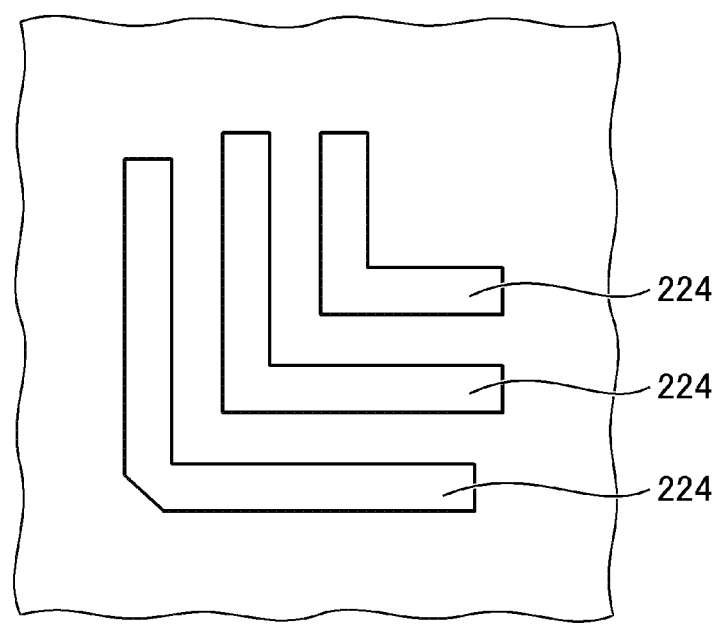
FIG. 10 is a view showing a light blocking film according to another modification of this embodiment.
Figure 11:
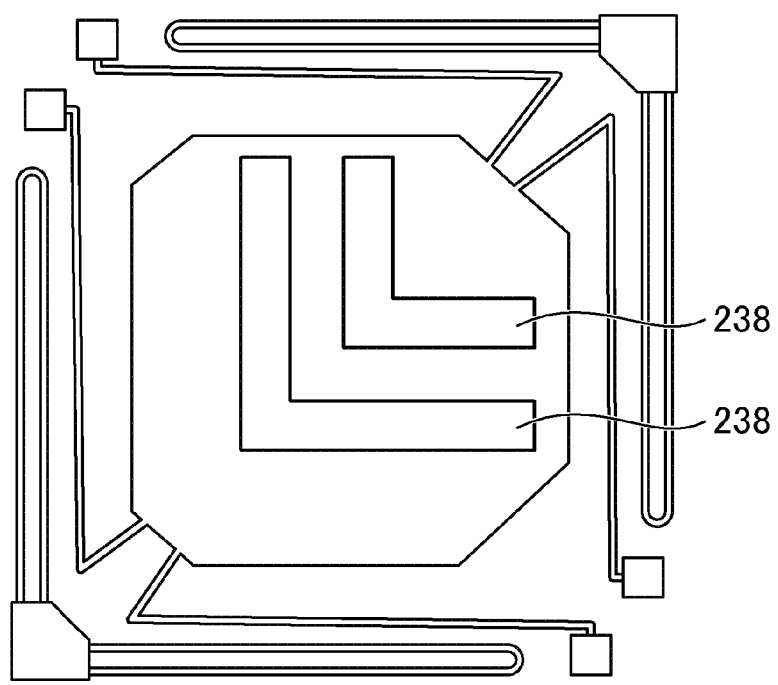
FIG. 11 is a view showing a shutter according to another modification of this embodiment.

In the above-mentioned embodiments, the number of fixed apertures formed in the light blocking film and the number of drive apertures formed in the shutter in one unit are set equal to each other. However, the number of fixed apertures and the number of drive apertures may differ from each other. For example, as shown in FIG. 10 and FIG. 11, the number of fixed apertures 224 in one unit may be set to 3 and the number of drive apertures 238 in one unit may be set to 2. Even when the number of fixed apertures 224 is larger than the number of drive apertures 238, by covering the fixed aperture 224 with the main plane of the shutter in blocking light, it is possible to realize a state where light is not irradiated from the corresponding pixel. Further, provided that there is no member which blocks light irradiated from the fixed aperture 224 when light passes through the fixed aperture 224, even when the fixed aperture 224 and the drive aperture 238 are not always made to communicate with each other, it is possible to provide a state where light is irradiated from the corresponding pixel. Accordingly, the constitution shown in FIG. 10 and FIG. 11 can also acquire the same manner of operation and advantageous effects as the above-mentioned embodiments. Further, since it is not always necessary to make the fixed aperture 224 and the drive aperture 238 communicate with each other, an area of the shutter can be decreased by an amount corresponding to the elimination of transmission of light through the fixed aperture 224 and the drive aperture 238.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A display device comprising:
   a pair of substrates which are arranged to oppose each other;
   a light blocking film deposited over a lower substrate of the pair of substrates, the light blocking film including a fixed aperture which allows the transmission of light;
   a shutter which has a drive aperture and controls the transmission of light and the interruption of the transmission of the light; and
   a drive part which moves the shutter and the drive aperture along a first axis, wherein
   the fixed aperture includes at least a fixed slit which extends along a second axis intersecting the first axis to define an angle, said angle between 0 degrees and 90 degrees, and
   the drive aperture includes at least a drive slit which extends parallel to the second axis.

2. The display device according to claim 1, wherein
   the fixed aperture includes a first fixed slit and a second fixed slit which are arranged in a first region and a second region respectively, the first region and a second region being positioned on either side of the first axis,
   the drive aperture includes a first drive slit and a second drive slit which are aligned with the first region and the second region respectively,
   the first fixed slit and the first drive slit extend along the second axis, and
   the second fixed slit and the second drive slit extend along a third axis which intersects the second axis.

3. The display device according to claim 2, wherein
the display device includes a plurality of pixels arranged in a matrix array,
each one of the plurality of pixels has a rectangular shape which is formed of a pair of first sides which extends along the second axis and a pair of second sides which extends along the third axis,
each one of the plurality of pixels includes said one shutter and at least said one fixed aperture,
the shutter includes at least one drive aperture, and
the first axis extends along the direction of a diagonal of the rectangular shape.

4. The display device according to claim 2, wherein
The first axis is the direction which bisects an angle made by the second axis and the third axis.

5. The display device according to claim 4, wherein
the angle made by the second axis and the third axis is 90 degrees.

6. The display device according to claim 2, wherein
the first fixed slit and the second fixed slit are formed into an integral L shape or V shape by connecting an end portion of the first fixed slit and an end portion of the second fixed slit to each other, and
the first drive slit and the second drive slit are formed into an integral L shape or V shape by connecting an end portion of the first drive slit and an end portion of the second drive slit to each other.

7. The display device according to claim 2, wherein
the first fixed slit and the second fixed slit are spaced apart from one another, and
the first drive slit and the second drive slit are spaced apart from one another.

8. The display device according to claim 2, wherein
the display device includes a plurality of pixels arranged in a matrix array,
each one of the plurality of pixels includes said one shutter and the plurality of fixed apertures, and
the shutter includes the plurality of drive apertures.

9. The display device according to claim 8, wherein
a number of the plurality of fixed apertures and a number of the plurality of drive apertures are equal.

10. The display device according to claim 8, wherein
a number of the plurality of fixed apertures is larger than a number of the plurality of drive apertures.

11. The display device according to claim 2, wherein
the drive part is formed on one substrate of the pair of substrates,
the drive part includes a first electrode which supports the shutter above said one substrate, and a second electrode which faces the first electrode, and the shutter is moved by a potential difference between the first electrode and the second electrode.

12. The display device according to claim 11, further comprising a pair of second electrodes, wherein
the pair of second electrodes is formed with the shutter sandwiched therebetween,
each one of the pair of second electrodes is arranged on a respective side of the shutter along the first axis, and
the first electrode is provided between each one of the pair of second electrodes and the shutter.

13. The display device according to claim 12, wherein
the first electrode includes a pair of first beams respectively arranged adjacent to two neighboring sides of a minimum quadrangular shape which circumscribes a planar profile of the shutter,
the second electrode includes a pair of second beams which are respectively arranged adjacent to the pair of first beams, and
one first beam of the pair of first beams and one second beam of the pair of second beams oppose each other.

14. The display device according to claim 13, wherein each first beam includes:
an intermediate portion which faces one of the second beams arranged adjacent to the first beams;
a connecting portion which extends from one end of the intermediate portion and is connected to the shutter; and
a fixing point whose position on said one substrate is fixed on a side of the intermediate portion opposite to the connecting portion, and
a distance from the connecting portion to a corner between said two neighboring sides of the minimum quadrangular shape arranged adjacent to the first electrode is smaller than a distance from the fixing point to the corner.

15. The display device according to claim 14, wherein
a distance between the intermediate portion of each first beam and a respective second beam on a side closer to the fixing point is smaller than a distance between the intermediate portion and said one second beam on a side closer to the connecting portion.

16. The display device according to claim 14, wherein
the intermediate portion includes an opposedly-facing region which opposes the planar profile of the shutter, and includes an extending region between the opposedly-facing region and the fixing point.

17. A display device comprising:
a pair of substrates which are arranged to oppose each other;
a light blocking film in which a fixed aperture which allows the transmission of light is formed;
a shutter which has a drive aperture and controls the transmission of the light and the interruption of the transmission of the light; and
a drive part which moves the shutter and the drive aperture along a first axis, wherein
the drive part is formed on a first substrate of the pair of substrates,
the drive part includes a pair of first electrodes which supports the shutter above the first substrate, and a pair of second electrodes opposing the pair of first electrodes,
each one of the pair of first electrodes is arranged on a respective side of the shutter along the first axis,
the shutter is moved by a potential difference between one of the first electrodes and a respective second electrode which oppose each other,
the pair of first electrodes is arranged so as to have portions which are respectively arranged on either side of a diagonal of a minimum quadrangular shape which circumscribes a planar profile of the shutter,
each first electrode includes a pair of first beams coupled to a respective side of the shutter along the first axis,
each second electrode has a pair of second beams including portions opposed to the pair of first beams of a respective first electrode
each first beam opposes a respective second beam.

18. The display device according to claim 17, wherein
the display device includes a plurality of pixels arranged in a matrix array,
each one of the plurality of pixels has a rectangular shape; and
the first axis extends along the direction of a diagonal of the minimum quadrangular shape.

19. The display device according to claim 17, wherein each first beam includes:
- an intermediate portion which faces one of said second beams arranged adjacent to the first beams;
- a connecting portion which extends from one end of the intermediate portion and is connected to the shutter; and
- a fixing point whose position on said one substrate is fixed on a side of the intermediate portion opposite to the connecting portion, and
- a distance from the connecting portion to the diagonal arranged adjacent to the first electrode is set smaller than a distance from the fixing point to said diagonal.

20. The display device according to claim 19, wherein a distance between the intermediate portion of each first beam and a respective second beam on a side closer to the fixing point is smaller than a distance between the intermediate portion and said one second beam on a side closer to the connecting portion.

21. The display device according to claim 19, wherein the intermediate portion includes an opposedly-facing region which opposes the planar profile of the shutter, and includes an extending region between the opposedly-facing region and the fixing point.

* * * * *